United States Patent
Zhou et al.

(10) Patent No.: US 9,991,266 B2
(45) Date of Patent: Jun. 5, 2018

(54) SEMICONDUCTOR MEMORY DEVICE AND SEMICONDUCTOR MEMORY ARRAY COMPRISING THE SAME

(71) Applicant: UNITED MICROELECTRONICS CORP., Hsin-Chu (TW)

(72) Inventors: Zhibiao Zhou, Singapore (SG); Ding-Lung Chen, Singapore (SG)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days. days.

(21) Appl. No.: 15/180,095

(22) Filed: Jun. 13, 2016

(65) Prior Publication Data

US 2017/0358582 A1    Dec. 14, 2017

(51) Int. Cl.
*H01L 27/108*    (2006.01)
*H01L 29/423*    (2006.01)
(Continued)

(52) U.S. Cl.
CPC ...... *H01L 27/10814* (2013.01); *H01L 23/528* (2013.01); *H01L 27/1225* (2013.01);
(Continued)

(58) Field of Classification Search
CPC .............. G11C 11/4097; G11C 11/404; G11C 14/0009; H01L 27/14612; H01L 27/1464; H01L 27/14609; H01L 27/14636; H01L 27/14643; H01L 29/7869; H01L 27/108; H01L 27/10844; H01L 27/1156; H01L 23/49827; H01L 21/486; H01L 27/10805; H01L 27/1085; H01L 27/10873; H01L 29/66969; H01L 27/1218; H01L 27/1255; H01L 27/124; H01L 27/1259; H01L 27/115; H01L 27/088; H01L 28/40; H01L 21/477; H01L 21/428; H01L 29/401; H01L 24/19
(Continued)

(56) References Cited

U.S. PATENT DOCUMENTS 6,384,439 B1 * 5/2002 Walker ................ G11C 11/4087
257/296
8,779,432 B2    7/2014 Yamazaki et al.
(Continued)

OTHER PUBLICATIONS

Zhou, Title of Invention: Semiconductor Memory Device Having Integrated DOSRAM and NOSRAM and Fabrication Method Thereof, U.S. Appl. No. 14/886,116, filed Oct. 19, 2015.
(Continued)

*Primary Examiner* — Mouloucoulaye Inoussa
(74) *Attorney, Agent, or Firm* — Winston Hsu

(57) ABSTRACT

A semiconductor array, the semiconductor memory array includes bit lines, word lines and memory cells. The bit lines are arranged in parallel in a first direction, and the word lines are arranged in parallel in a second direction which is different from the first direction. The memory cells are arranged in an array and electrically connected to corresponding bit lines and word lines respectively, and any two memory cells adjacent to each other share a same oxide semiconductor layer as a channel layer. The present invention also relates to a semiconductor memory device including two memory cells sharing a same oxide semiconductor layer as a channel layer.

20 Claims, 6 Drawing Sheets

(51) Int. Cl.
H01L 27/12 (2006.01)
H01L 29/786 (2006.01)
H01L 49/02 (2006.01)
H01L 23/528 (2006.01)

(52) U.S. Cl.
CPC ...... *H01L 27/1248* (2013.01); *H01L 27/1255* (2013.01); *H01L 28/60* (2013.01); *H01L 29/42356* (2013.01); *H01L 29/7869* (2013.01); *H01L 29/78648* (2013.01)

(58) Field of Classification Search
USPC ........................................................ 365/149
See application file for complete search history.

(56) References Cited

U.S. PATENT DOCUMENTS

| 8,780,614 | B2 | 7/2014 | Takemura | |
|---|---|---|---|---|
| 2011/0101351 | A1* | 5/2011 | Yamazaki | G11C 11/405 |
| | | | | 257/57 |
| 2012/0195104 | A1* | 8/2012 | Takemura | G11C 11/404 |
| | | | | 365/149 |

OTHER PUBLICATIONS

Wu, Title of Invention: Memory Cell With Oxide Semiconductor Field Effect Transistor Device Integrated Therein, U.S. Appl. No. 14/856,565, dated Sep. 17, 2015.

* cited by examiner

SEMICONDUCTOR MEMORY DEVICE AND SEMICONDUCTOR MEMORY ARRAY COMPRISING THE SAME

BACKGROUND OF THE INVENTION

1. Field of the Invention

The present invention relates to a semiconductor device and a semiconductor memory array comprising the same, and more particularly to a semiconductor memory device having an oxide semiconductor field-effected transistor (OS-FET), and a semiconductor memory array comprising the same.

2. Description of the Prior Art

In modern society, the micro-processor systems comprising integrated circuits (IC) are ubiquitous devices, being utilized in diverse fields such as automatic control electronics, mobile communication devices and personal computers. With the development of technology and the increase of original applications for electronic products, the IC devices are becoming smaller, more delicate and more diversified.

In a wide variety of materials, indium oxide ($In_2O_3$), tin oxide ($SnO_2$) and zinc oxide (ZnO) are generally known transparent conductive oxides. Indium tin oxide (ITO), when being formed of a thin film, can be used as a transparent electrode in a flat panel display or a touch sensor of a capacitance type touch panel. Tin oxide and zinc oxide can be used in a transparent solar cell electrode. However, these materials are essentially semiconductor materials, and it is desired for researchers to develop a semiconductor device by using their semiconductor material properties, such as an oxide semiconductor transistor.

However, for current semiconductor device having an oxide semiconductor material, there is still a need for better designs thereto gain better performance.

SUMMARY OF THE INVENTION

It is one of the primary objectives of the present invention to provide a semiconductor memory device and a semiconductor memory array comprising the same, in which two adjacent memory cells share the same oxide semiconductor layer as a channel layer, thereto gain better product performance and space utility.

To achieve the purpose described above, one embodiment of the present invention provides a semiconductor memory device including an oxide semiconductor (OS) layer, a first and a second bottom gate electrodes, a first and a second source/drain layers, a sharing source/drain layer, a first and second top gate electrodes and two capacitors. The OS layer is disposed on a first insulating layer. The first and second gate electrodes are separately disposed below the first insulating layer. The first and second source/drain layers are separately disposed on the OS layer. The sharing source/drain layer is disposed on the OS layer between the first and the second source/drain layers. The first and second top gate electrodes are separately disposed on the OS layer between first source/drain layer and the sharing source/drain layer, and between the second source/drain layer and the sharing source/drain layer, respectively. The two capacitors are disposed on the first top gate electrode and the second top gate electrode and respectively and electrically connected to the first source/drain layer and the second source/drain layer.

To achieve the purpose described above, one embodiment of the present invention provides a semiconductor memory array including plural bit lines, plural word lines and plural memory cells. The bit lines are arranged in parallel in a first direction. The word lines are arranged in parallel in a second direction which is different from the first direction. The memory cells are arranged in an array and electrically connected to corresponding bit lines and word lines respectively, and any two memory cells adjacent to each other share a same oxide semiconductor layer as a channel layer.

According to the above, the present invention provides a semiconductor memory array including a plurality of memory cells arranged in an array, in which any two adjacent memory cells share the same oxide semiconductor layer as a channel layer, for gaining better device performance and space utility.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 2 are schematic diagrams illustrating a semiconductor memory device according to a first embodiment of the present invention, wherein:

FIG. 1 shows a schematic top view of a semiconductor memory device according to the first embodiment of the present invention; and FIG. 2 shows a schematic cross-sectional view of a semiconductor memory device take along a cross line A-A' in FIG. 1.

DETAILED DESCRIPTION

To provide a better understanding of the presented invention, preferred embodiments will be described in detail. The preferred embodiments of the present invention are illustrated in the accompanying drawings with numbered elements.

Figure 1:
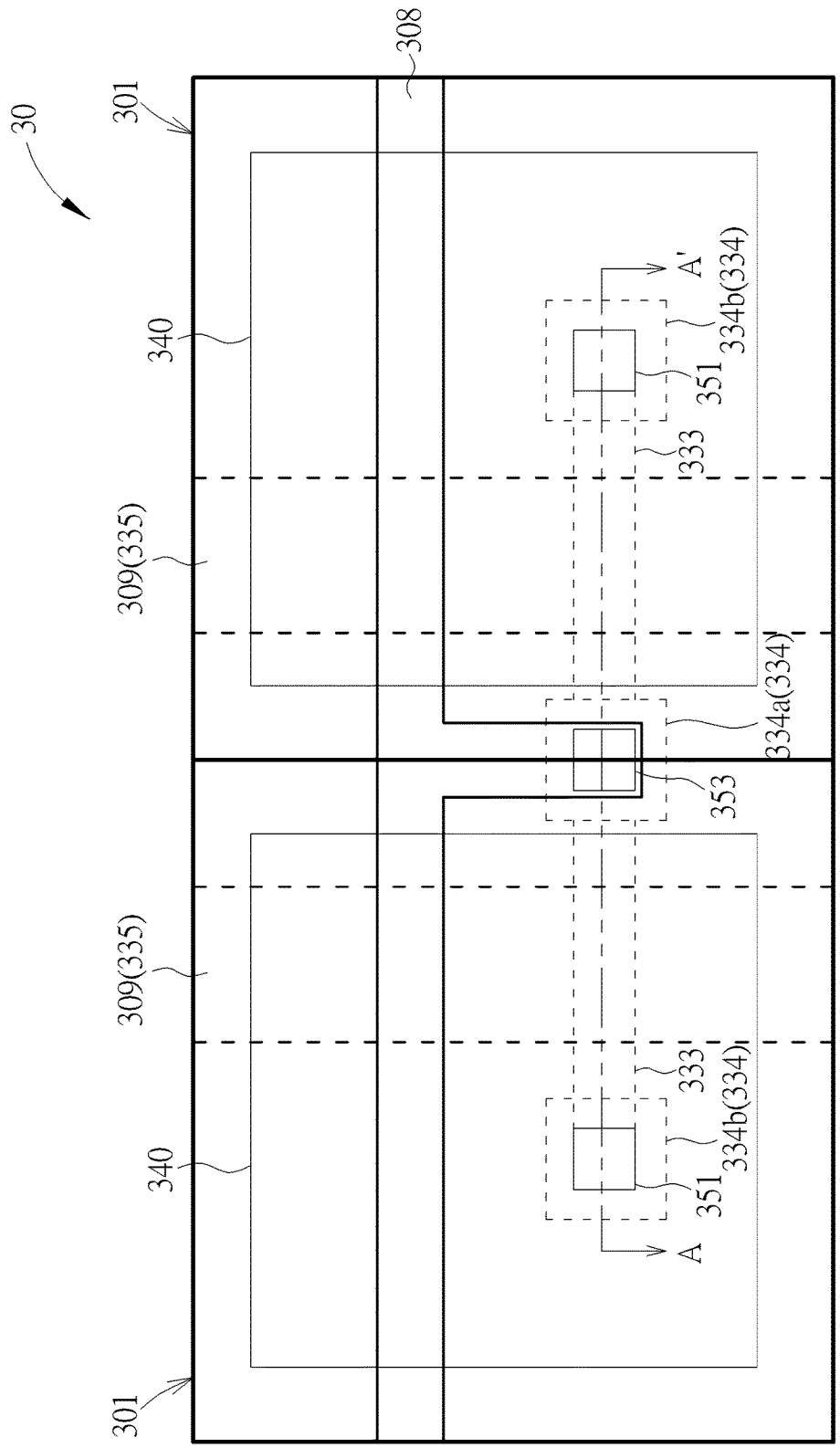
Figure 2:
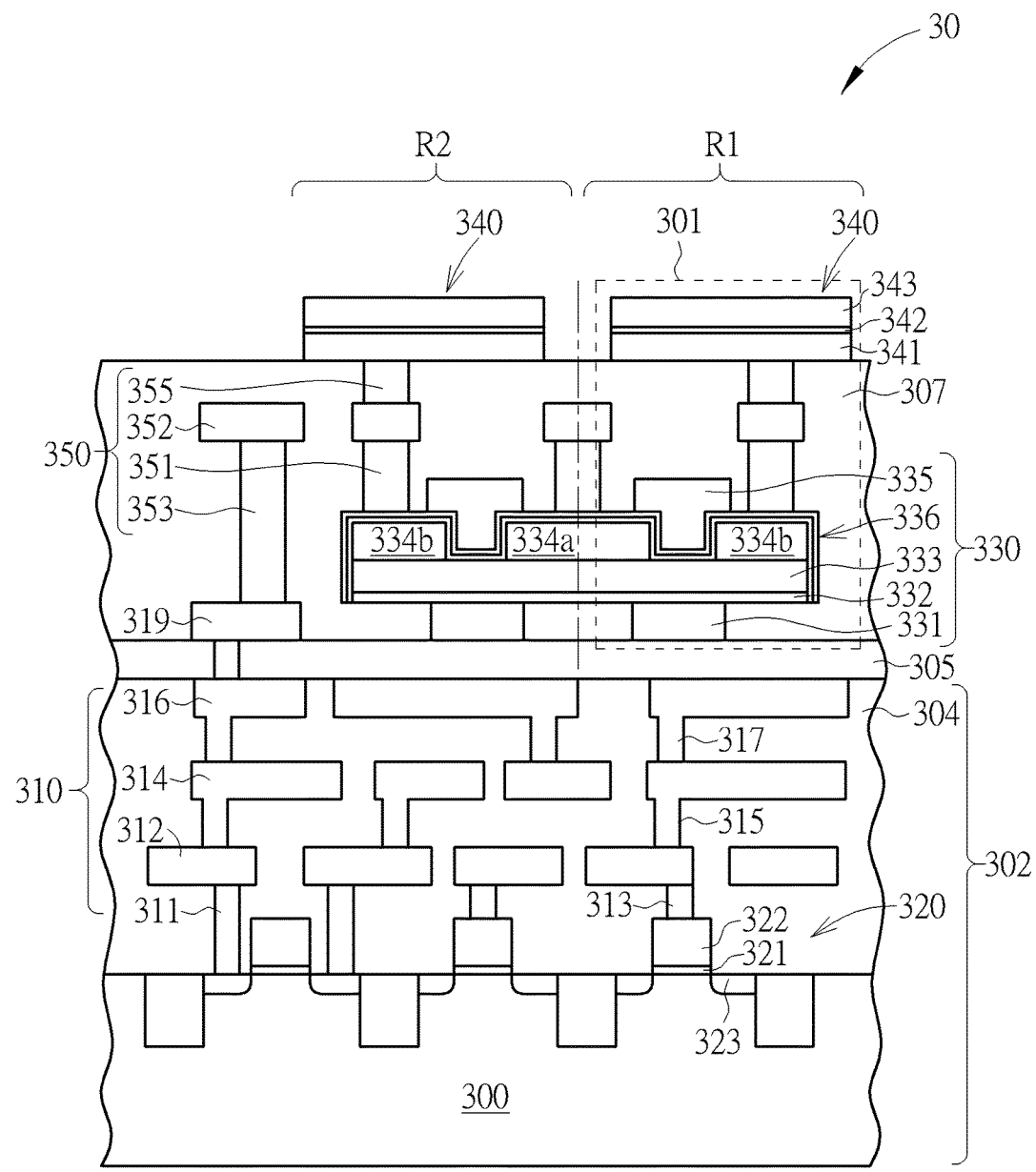

Please refer to FIG. 1 to FIG. 2, which are schematic diagrams illustrating a semiconductor device 30 according to the first embodiment of the present invention. It is noted that, FIG. 1 only shows a schematic top view of the semiconductor device 30, in which some elements such as contact vias or internal circuits are optionally omitted for simplify the description. In the present embodiment, the semiconductor device 30 includes two dynamic oxide semiconductor random access memory (DOSRAM) cells 301 which share the same oxide semiconductor (OS) layer as a channel layer, and an internal circuit is disposed in a substrate 302 below the DOSRAM cells 301 for electrically connecting thereto.

In view of the semiconductor device 30 of the present embodiment, the DOSRAM cells 301 are disposed on an active surface of the substrate 302, and the substrate 302 further includes a semiconductor substrate 300 such as a silicon containing substrate, an epitaxial substrate or a silicon-on-insulator substrate, and the internal circuit disposed in a first dielectric layer 304 on the semiconductor substrate 300. Precisely speaking, the semiconductor substrate 300 is firstly provided, and the internal circuit is then formed on the semiconductor substrate 300. The internal circuit includes at least one transistor 320 such as a MOS FET disposed on the semiconductor substrate 300. In the present embodiment, three transistors 320 are separately disposed in or on the semiconductor substrate 300 and each of them includes a gate insulating layer 321 such as silicon dioxide ($SiO_2$), silicon nitride (SiN) or a high dielectric constant (high-k) material, a gate electrode 322 such as undoped/doped polysilicon, amorphous silicon or metals, and two source/drain doping regions 323 at two sides of the gate electrode 322 in the semiconductor substrate 300.

The internal circuit also includes a metal interconnection structure 310 disposed in the first dielectric layer 304, which includes contact plugs 311, 313, metal layers 312, 314, 316 and via plugs 315, 317, and terminals of the transistors 320 may be electrically connected to the metal layer 312 through the contact plugs 311, 313 as shown in FIG. 2. In one embodiment, the first dielectric layer 304 may include a monolayer inter-layer dielectric (ILD) film or a multilayered ILD film, for example including silicon oxide, silicon nitride, silicon oxynitride, or other low-k dielectric materials, and the metal layers 314, 316 and the via plugs 315, 317 may be formed through a copper damascene technique, but is not limited thereto. Thus, the internal circuit and the semiconductor substrate 300 may together form the substrate 302 shown in FIG. 2.

Then, the DOSRAM cells 301 are formed on the first dielectric layer 304 (namely, the substrate 302) within two different cell regions R1, R2 respectively, and each of the DOSRAM cells 301 includes a dual gate oxide semiconductor (OS) transistor 330 and a capacitor structure 340. The dual gate OS transistor 330 in each DOSRAM cell 301 includes a bottom gate electrode 331 disposed below a channel layer 333, and a top gate electrode 335 disposed on the channel layer 333 in alignment with the bottom gate electrode 331. It is worth noting that, the two dual gate OS transistors 330 of the two DOSRAM cells 301 share the same channel layer 333 and a sharing source/drain 334a, as shown in FIGS. 1 and 2.

Specifically, according to the dual gate OS transistors 330 of the present embodiment, two bottom gate electrodes 331 are firstly formed separately on a second dielectric layer 305, within the cell regions R1, R2 respectively. In one embodiment, the formation of the bottom gate electrodes 331 may be integrated with a forming process of a dual damascene 319 shown in FIG. 2 for example through a copper damascene technique, but is not limited thereto. Next, a first insulating layer 332 and the channel layer 333 are sequentially formed on the bottom gate electrodes 331 and the second dielectric layer 305. For example, the insulation layer 332 may include a monolayer film as shown in FIG. 2 or a multilayer film, and which may include a low-k dielectric material like silicon dioxide, or a high-k dielectric material like a rare earth metal oxide such as hafnium oxide ($HfO_2$), and the channel layer 333 may include an oxide semiconductor (OS) layer such as indium gallium zinc oxide (InGaZnO), indium gallium oxide (IGaO), indium zinc oxide (IZO), indium zinc oxide (IZO) or a c-axis aligned crystalline OS (CAAC-OS) material, but is not limited thereto. Preferably, the insulating layer 332 and the channel layer 333 covers the bottom gate electrodes 331 both in the cell regions R1, R2 underneath.

Following these, a conductive layer is formed on the channel layer 333 to form source/drain layers 334 at two sides of the bottom gate electrodes 331. That is, three source/drain layers 334 may be separately disposed on the channel layer 333 as shown in FIG. 2, and the two bottom gate electrodes 331 share the middle source/drain layers 334a which is disposed at the junction of the two cell regions R1, R2. Then, a second insulating layer 336 and the top gate electrodes 335 are formed on the source/drain layers 334, wherein the second insulating layer 336 is disposed between the top gate electrodes 335 and the source/drain layers 334. In one embodiment, the second insulating layer 336 may include a monolayer film or a multilayer film 336 as shown in FIG. 2, for example including an OS material like InGaZnO, $InGaO_2$ or $InZnO_2$, or a high-k dielectric layer like $HfO_2$ or aluminum oxide ($Al_2O_3$), but is not limited thereto. Thus, the two bottom gate electrodes 331, the channel layer 333, the source/drain layers 334 and the top gate electrode 335 may together form two dual gate OS transistors 330 with in the cell regions R1, R2 respectively as shown in FIG. 2.

It is noted that, the channel layer 333, the source/drain layers 334 and the top gate electrodes 335 are formed in a third dielectric layer 307 disposed on the second dielectric layer 305, and a metal interconnection structure 350 is also disposed in the third dielectric layer 307 for electrically connecting the dual gate OS transistors 330 to two capacitor structures 340. The metal interconnection structure 350 includes a metal layer 352 and via plugs 351, 353, 355. Likewise, the third dielectric layer 307 may also include a monolayer dielectric film or a multilayer dielectric film, for example including silicon oxide, silicon nitride, silicon oxynitride, or other low-k dielectric materials. In one embodiment, the metal layers 352 and via plugs 351, 353 may also be formed through a copper damascene technique.

After that, the capacitor structures 340 are formed, and each of the capacitor structures 340 includes a bottom plate (BP) electrode 341 such as a titanium nitride (TiN) or a tungsten (W) layer, a high-k dielectric layer 342 such as a $HfO_2$ or $Al_2O_3$ layer, and a top plate (TP) electrode 343 stacked one over another on the third dielectric layer 307, for example through at least one lithography and etching processes known in the art. For example, the BP electrode 341 is electrically coupled to the source/drain layer 334b of the dual gate OS transistor 330 through at least the metal layer 352 and the via plug 351, thereby constituting the DOSRAM cells 301 within the cell region R1, R2 as shown in FIG. 2.

In this way, the semiconductor memory device 30 of the first embodiment in the present invention is obtained. It is noted that, the semiconductor memory device 30 includes two DOSRAM cells 301, in which the source/drain layers 334b of the two dual gate OS transistors 330 are electrically connected to the BP electrodes 341 of the two capacitor structures 340 respectively, and the source/drain layer 334a shared by the two dual gate OS transistors 330 is electrically connected to a bit line 308, as shown in FIG. 1. On the other hand, the top gate electrodes 331 of the two dual gate OS transistors 330 are a common gate. Thus, in a proper cell write operation, the word line 309 (namely, the upper portion of the top gate electrode 335 as shown in FIG. 1) is activated to transfer a data signal from the bit line 308 to the capacitor structures 340 for data storage. To write a logical "0" into the capacitor structures 340, a bit line voltage is raised to a relatively high potential, such as Vdd. Conversely, to write a logical "1," into the capacitor structures 340, a voltage having a relatively low potential (i.e., 0 v or ground) is applied to the bit line 308.

It is worth noting that, the semiconductor memory device of the present embodiment includes the two DOSRAM cells which share the same OS layer as a channel layer and the same source/drain layer connected to the bit line. That is, a more compacted structure is obtained in the present invention thereto gain better device performance and space utility. It is understood that the semiconductor memory device in the present invention may further include multiple DOSRAM cells, with any two adjacent DOSRAM cells sharing the same OS layer as the channel layer.

The following description will detail the different embodiments of the semiconductor memory device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 3:
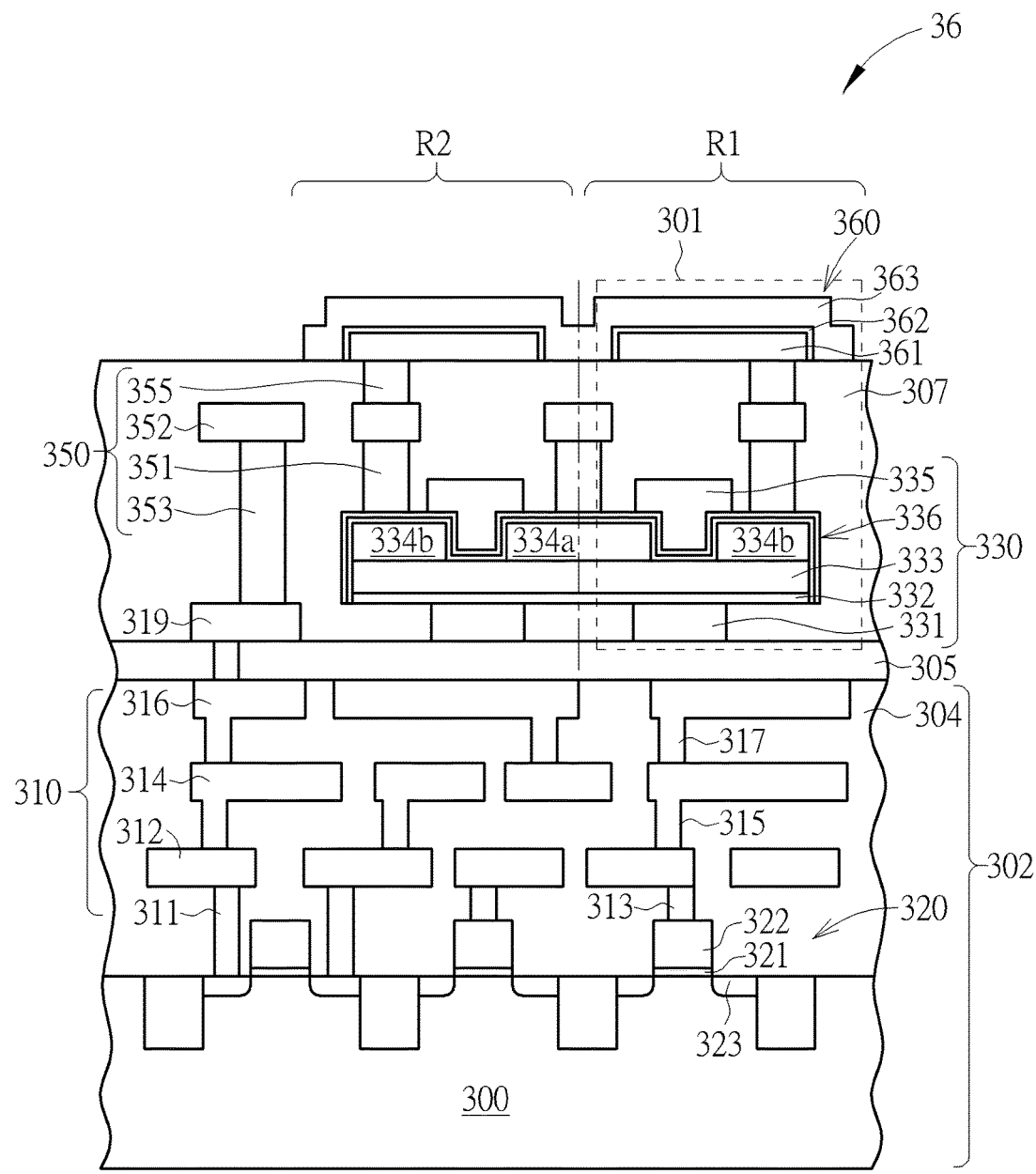
FIG. 3 is a schematic diagram illustrating a semiconductor memory device according to a second embodiment of the present invention.

Please refer to FIG. 3, which shows a schematic diagram of a semiconductor memory device 36 according to the second embodiment of the present invention. The structure of the semiconductor memory device 36 is substantially similar to that of the semiconductor memory device 30 shown in FIGS. 1-2, and the differences between these two semiconductor memory devices 30, 36 are that the TP electrodes of the two capacitor structures are monolithic. In other words, according to the semiconductor memory device 36 in present embodiment, each of the capacitor structures 360 includes a BP electrode 361 such as a TiN or a W layer, a high-k dielectric layer 362 such as a $HfO_2$ or an $Al_2O_3$ layer, and a TP electrode 363 stacked one over another on the third dielectric layer 307, wherein the TP electrode 363 is shared by the two capacitor structures 360, so as to form a further compact structure through a simplified process and design. Thus, the semiconductor memory device 36 in the present embodiment may gain more efficiency space utility.

Figure 4:
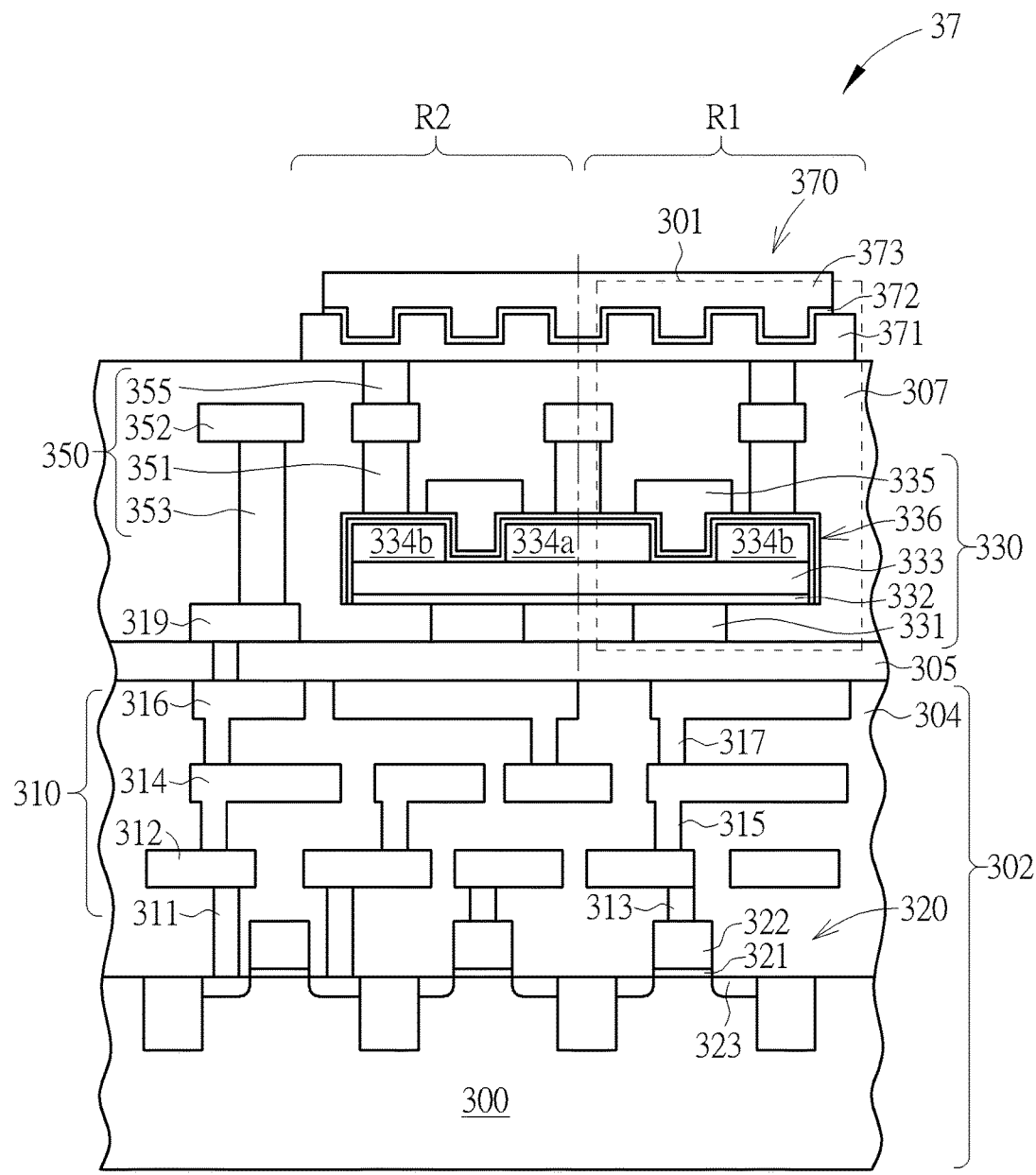
FIG. 4 is a schematic diagram illustrating a semiconductor memory device according to a third embodiment of the present invention.

Please refer to FIG. 4, which shows a schematic diagram of a semiconductor memory device 37 according to the third embodiment of the present invention. The structure of the semiconductor memory device 37 is substantially similar to that of the semiconductor memory device 36 shown in FIG. 3, and the differences between these two semiconductor memory devices 36, 37 are that the capacitor structure 370 includes a trenched BP electrode 371. Precisely, each of the capacitor structures 370 includes the trenched BP electrode 371 such as a TiN or a W layer, a high-k dielectric layer 372 such as a $HfO_2$ or $Al_2O_3$ layer, and a TP electrode 373 stacked one over another on the third dielectric layer 307, and the trenched BP electrode 371 includes a plurality of holes (not shown in the drawings) formed therein, for example in an N×N array. Through this arrangement, the capacitor structures 370 may obtain higher density and the semiconductor memory device 37 in the present embodiment thereto gain better space utility and device performance. It is understood that the semiconductor memory device in the present invention may also include the BP electrodes in other shape, such as comb-liked bottom electrode (not shown in the drawings), but is not limited thereto.

Figure 5:
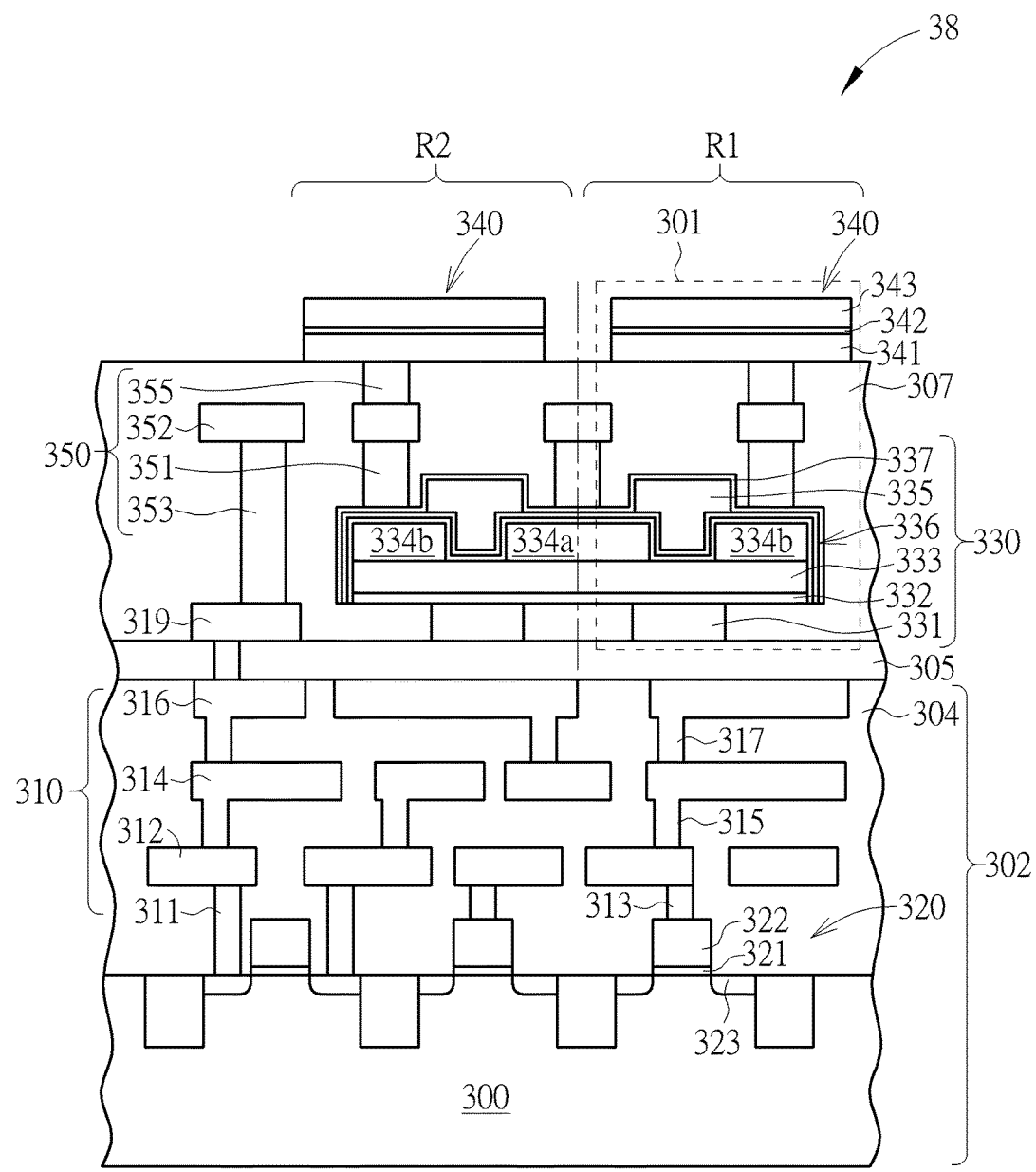
FIG. 5 is a schematic diagram illustrating a semiconductor memory device according to a fourth embodiment of the present invention.

Please refer to FIG. 5, which shows a schematic diagram of a semiconductor memory device 38 according to the fourth embodiment of the present invention. The structure of the semiconductor memory device 38 is substantially similar to that of the semiconductor memory device 30 shown in FIGS. 1-2, and the differences between these two semiconductor memory devices 30, 38 are that a seal layer 337 is conformally formed on the dual gate OS transistor 330 to simultaneously cover the dual gate OS transistors 330 both in the cell regions R1, R2. For example, the seal layer 337 may include a dense dielectric material, such as $HfO_2$ or $Al_2O_3$. In this way, the dual gate OS transistor 330 is enclosed by the seal layer 337, such that, the current leakage issue of the dual gate OS transistor 330 in the present embodiment may be improved. Thus, the semiconductor memory device 38 in the present embodiment may be able to obtain better device performance.

Figure 6:
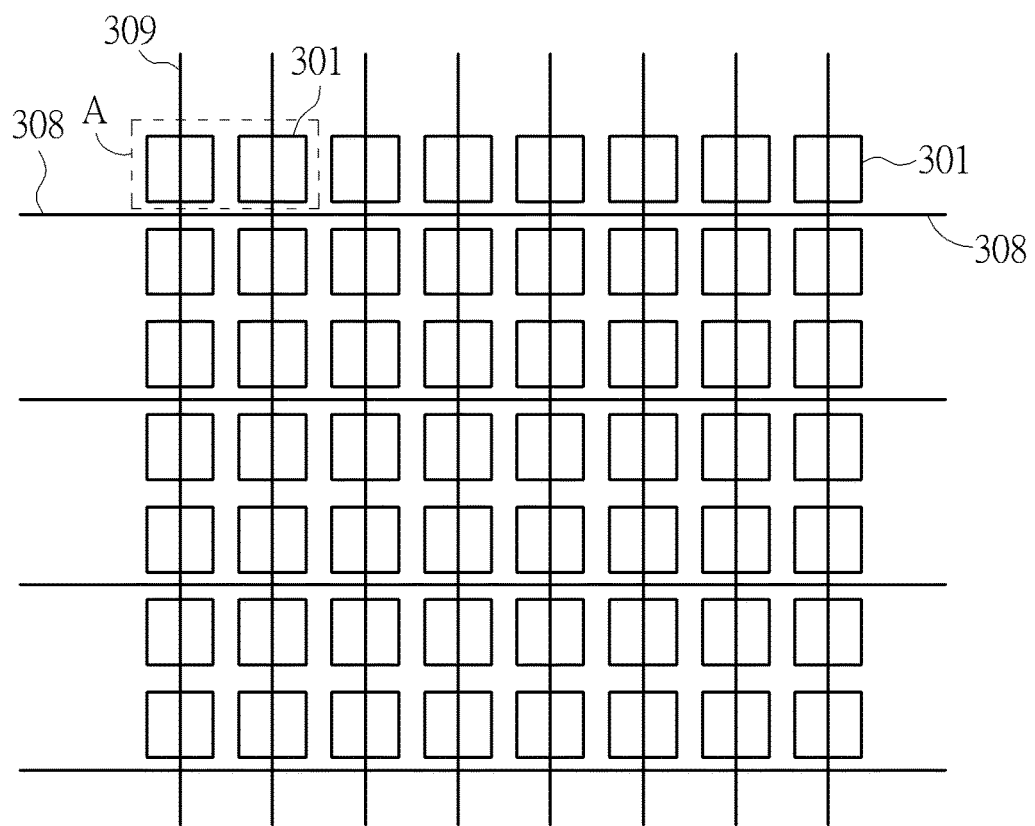
FIG. 6 is a schematic diagram illustrating a semiconductor memory array according to a preferably embodiment of the present invention.

Please refer to FIG. 6, which show a schematic diagram of a semiconductor memory array according to a preferred embodiment of the present invention. As shown in FIG. 6, the memory array includes a plurality of DOSRAM cells 301 arranged in an array and the layout of the DOSRAM cells 301 shows the relative position of the array components in a top view. It is noted that, each two DOSRAM cells 301 arranged in parallel in a first direction such as an x-direction share the same OS layer as a channel layer, and share the same source/drain layer, thereto form a compact memory device A. In the semiconductor memory array, a plurality of bit lines 308 is arranged in parallel in the first direction, and a plurality of word line 309 is arranged in parallel in a second direction which is different from the first direction, such as a y-direction. That is, the bit lines 308 may cross the bit lines 308, as shown in FIG. 6, and the DOSRAM cells 301 are electrically connected to corresponding bit lines 308 and corresponding word lines 309 respectively. It should be understood that both word lines 309 and bit lines 308 extend throughout the array and include connections to the internal circuitry which is disposed below the array.

In summary, the present invention provides a semiconductor memory array including a plurality of memory cells arranged in an array, in which any two adjacent memory cells can form a compact device sharing the same oxide semiconductor layer as a channel layer and using the same source/drain layer, for gaining better device performance and space utility.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor memory device, comprising:
   an oxide semiconductor layer disposed on a first insulating layer;
   a first bottom gate electrode and a second bottom gate electrode separately disposed below the first insulating layer;
   a first source/drain layer and a second source/drain layer separately disposed on the oxide semiconductor layer, wherein a sidewall of the first source/drain layer and a sidewall of the second source/drain layer are vertically aligned with two opposite sidewalls of the oxide semiconductor layer respectively;
   a sharing source/drain layer disposed on the oxide semiconductor layer between the first source/drain layer and the second source/drain layer, wherein the first source/drain layer, the second source/drain layer and the sharing source/drain layer directly contact a top surface of the oxide semiconductor layer;

a second insulating layer disposed on the first source/drain layer, the second source/drain layer and the sharing source/drain layer, and simultaneously covering the two opposite sidewalls of the oxide semiconductor layer;
a first top electrode and a second top electrode separately disposed on the oxide semiconductor layer between first source/drain layer and the sharing source/drain layer, and between the second source/drain layer and the sharing source/drain layer, respectively; and
two capacitors disposed on the first top electrode and the second top electrode and respectively and electrically connected to the first source/drain layer and the second source/drain layer.

2. The semiconductor memory device according to claim 1, further comprising:
the second insulating layer disposed between the first top gate electrode and the first source/drain layer and the sharing source/drain layer, and between the second top gate electrode and the second source/drain layer and the sharing source/drain layer.

3. The semiconductor memory device according to claim 1, wherein the first top gate electrode, the first source/drain layer, the sharing source/drain layer, and the first bottom gate electrode are disposed on a semiconductor substrate in a first cell region, and the first top gate electrode, the first source/drain layer, the sharing source/drain layer, the oxide semiconductor layer and the first bottom gate electrode together form a first transistor.

4. The semiconductor memory device according to claim 3, wherein the first transistor and the capacitor disposed in the first cell region together form a first memory cell.

5. The semiconductor memory device according to claim 3, wherein the second top gate electrode, the second source/drain layer, the sharing source/drain layer, and the second bottom gate electrode are disposed on the semiconductor substrate in a second cell region, and the second top gate electrode, the second source/drain layer, the sharing source/drain layer, the oxide semiconductor layer and the second bottom gate electrode together form a second transistor.

6. The semiconductor memory device according to claim 5, wherein the second transistor and the capacitor disposed in the second cell region together form a second memory cell.

7. The semiconductor memory device according to claim 5, further comprising a dielectric layer, wherein the first transistor and the second transistor are disposed in the dielectric layer.

8. The semiconductor memory device according to claim 5, further comprising:
a seal layer conformally covered on the first transistor and the second transistor.

9. The semiconductor memory device according to claim 8, wherein the seal layer comprises $Al_2O_3$ or $HfO_2$.

10. The semiconductor memory device according to claim 1, wherein each of the capacitors comprises a bottom plate electrode, a high-k dielectric layer on the bottom plate electrode and a top plate electrode on the high-k dielectric layer.

11. The semiconductor memory device according to claim 9, wherein the top plate electrodes of the capacitors are monolithic.

12. The semiconductor memory device according to claim 9, wherein the top plate electrodes of the capacitors are separated from each other.

13. The semiconductor memory device according to claim 9, wherein the bottom plate electrode comprises a plurality of trenches, and the high-k dielectric layer and the top plate electrode are disposed in the trench.

14. A semiconductor memory array, comprising:
a plurality of bit lines, arranged in parallel in a first direction;
a plurality of word lines arranged in parallel in a second direction being different from the first direction; and
a plurality of the memory cells arranged in an array and electrically connected to corresponding bit lines and word lines respectively, and any two memory cells adjacent to each other sharing a same oxide semiconductor layer, wherein the same oxide semiconductor layer is disposed below two source/drain layers disposed in two memory cells with two opposite sidewalls of the same oxide semiconductor layer respectively vertically aligned with a sidewall each of the two source/drain layers, and the two source/drain layers directly contact a top surface of the same oxide semiconductor layer, and a second insulating layer disposed on the two source/drain layers and simultaneously covering the two opposite sidewalls of the same oxide semiconductor layer and the sidewall of each of the two source/drain layers.

15. The semiconductor memory array according to claim 14, wherein the two memory cells adjacent to each other comprises:
the same oxide semiconductor layer disposed on a first insulating layer;
a first bottom gate electrode and a second bottom gate electrode separately disposed below the first insulating layer;
a first source/drain layer and a second source/drain layer separately disposed on the same oxide semiconductor layer;
a sharing source/drain layer disposed on the same oxide semiconductor layer between the first source/drain layer and the second source/drain layer;
a first top electrode and a second top electrode separately disposed on the same oxide semiconductor layer between first source/drain layer and the sharing source/drain layer, and between the second source/drain layer and the sharing source/drain layer, respectively; and
two capacitors disposed on the first top electrode and the second top electrode and electrically connected to the first source/drain layer and the second source/drain layer respectively.

16. The semiconductor memory device according to claim 15, wherein the first top gate electrode, the first source/drain layer, the sharing source/drain layer, and the first bottom gate electrode are disposed in a first cell region, and the first top gate electrode, the first source/drain layer, the sharing source/drain layer, the same oxide semiconductor layer and the first bottom gate electrode together forms a first transistor.

17. The semiconductor memory device according to claim 15, wherein the second top gate electrode, the second source/drain layer, the sharing source/drain layer, and the second bottom gate electrode are disposed in a second cell region, and the second top gate electrode, the second source/drain layer, the sharing source/drain layer, the same oxide semiconductor layer and the second bottom gate electrode together forms a second transistor.

18. The semiconductor memory device according to claim 15, wherein each of the capacitors comprises a bottom plate electrode, a high-k dielectric layer on the bottom plate electrode and a top plate electrode on the high-k dielectric layer.

19. The semiconductor memory device according to claim 18, wherein the top plate electrodes of the capacitors are monolithic.

20. The semiconductor memory device according to claim 18, wherein the bottom plate electrode comprises a trenched bottom plate electrode.

\* \* \* \* \*